(12) United States Patent
Dupoiron et al.

(10) Patent No.: US 11,930,255 B2
(45) Date of Patent: Mar. 12, 2024

(54) COLOR AND INFRARED IMAGE SENSOR

(71) Applicant: ISORG, Limoges (FR)

(72) Inventors: Camille Dupoiron, Grenoble (FR); Benjamin Bouthinon, Grenoble (FR)

(73) Assignee: ISORG, Limoges (FR)

( * ) Notice: Subject to any disclaimer, the term of this patent is extended or adjusted under 35 U.S.C. 154(b) by 199 days.

(21) Appl. No.: 17/435,339

(22) PCT Filed: Feb. 21, 2020

(86) PCT No.: PCT/FR2020/050337
§ 371 (c)(1),
(2) Date: Aug. 31, 2021

(87) PCT Pub. No.: WO2020/178497
PCT Pub. Date: Sep. 10, 2020

(65) Prior Publication Data
US 2022/0141399 A1   May 5, 2022

(30) Foreign Application Priority Data
Mar. 1, 2019   (FR) ...................... 19/02157

(51) Int. Cl.
| | | |
|---|---|---|
| *H01L 27/146* | (2006.01) | |
| *H04N 23/11* | (2023.01) | |
| *H10K 39/32* | (2023.01) | |

(52) U.S. Cl.
CPC ............ *H04N 23/11* (2023.01); *H10K 39/32* (2023.02)

(58) Field of Classification Search
None
See application file for complete search history.

(56) References Cited

U.S. PATENT DOCUMENTS

| | | |
|---|---|---|
| 6,677,656 B2 | 1/2004 | François |
| 10,056,423 B1 | 8/2018 | Huang |
| (Continued) | | |

FOREIGN PATENT DOCUMENTS

| | | |
|---|---|---|
| JP | 2017-208496 A | 11/2017 |
| WO | 2018/020977 A1 | 2/2018 |
| WO | 2018/025545 A1 | 2/2018 |

OTHER PUBLICATIONS

Authorized Officer: Cabrita, Ana, International Search Report issued in PCT application No. PCT/FR2020/050337, dated Jul. 1, 2020, 2 pp.

(Continued)

*Primary Examiner* — Eileen M Adams

(74) *Attorney, Agent, or Firm* — Kaplan Breyer Schwarz, LLP

(57) ABSTRACT

A color and infrared image sensor includes a silicon substrate, MOS transistors formed in the substrate and on the substrate, first photodiodes at least partly formed in the substrate, a photosensitive layer covering the substrate, and color filters, the photosensitive layer being interposed between the substrate and the color filters. The image sensor further includes first and second electrodes on either side of the photosensitive layer and delimiting second photodiodes in the photosensitive layer, the first photodiodes being configured to absorb the electromagnetic waves of the visible spectrum and of a first portion of the infrared spectrum and the photosensitive layer being configured to absorb the electromagnetic waves of the visible spectrum and to give way to the electromagnetic waves of said first portion of the infrared spectrum.

11 Claims, 6 Drawing Sheets

(56) References Cited

U.S. PATENT DOCUMENTS

| | | |
|---|---|---|
| 11,527,565 B2 | 12/2022 | Dupoiron et al. |
| 2005/0205958 A1 | 9/2005 | Taniguchi et al. |
| 2011/0260059 A1 | 10/2011 | Jiang et al. |
| 2012/0211851 A1* | 8/2012 | Mori .................. H01L 27/1464 |
| | | 257/E31.127 |
| 2013/0284889 A1 | 10/2013 | Giffard et al. |
| 2014/0184808 A1 | 7/2014 | Ryoki et al. |
| 2015/0287766 A1 | 10/2015 | Kim et al. |
| 2016/0181226 A1 | 6/2016 | Wan |
| 2016/0380032 A1 | 12/2016 | Park et al. |
| 2017/0148841 A1 | 5/2017 | Matsumoto et al. |
| 2018/0084167 A1* | 3/2018 | Qian .................... G01J 3/0208 |
| 2018/0295336 A1 | 10/2018 | Chen |
| 2018/0301509 A1 | 10/2018 | Ishii et al. |
| 2019/0110037 A1 | 4/2019 | Lukac |
| 2019/0115386 A1 | 4/2019 | Ma et al. |
| 2019/0189696 A1 | 6/2019 | Yamaguchi et al. |
| 2019/0214591 A1 | 7/2019 | Park et al. |
| 2019/0237500 A1* | 8/2019 | Enichlmair ....... H01L 27/14636 |
| 2019/0239821 A1 | 8/2019 | Heo et al. |
| 2019/0245008 A1 | 8/2019 | Lee et al. |
| 2019/0363269 A1 | 11/2019 | Leem et al. |
| 2020/0412980 A1 | 12/2020 | Agranov et al. |
| 2021/0297607 A1 | 9/2021 | Wang et al. |
| 2022/0141400 A1 | 5/2022 | Dupoiron et al. |
| 2022/0157879 A1 | 5/2022 | Sohn et al. |
| 2023/0261029 A1 | 8/2023 | Ebiko |

OTHER PUBLICATIONS

Authorized Officer: Cabrita, Ana, International Search Report issued in PCT application No. PCT/FR2020/050336, dated Jun. 12, 2020, 2 pp.

Authorized Officer: Cabrita, Ana, International Search Report issued in PCT application No. PCT/FR2020/050338, dated Jul. 1, 2020, 2 pp.

Notice of Allowance issued in U.S. Appl. No. 17/435,293, dated Aug. 12, 2022, 13 pp.

Notice of Allowance received for U.S. Appl. No. 17/435,293, dated Aug. 12, 2022, 12 pages.

English translation of the Written Opinion of the International Search Authority issued in PCT application No. PCT/FR2020/050338, dated Sep. 24, 2021, Jul. 1, 2020, 4 pp.

English translation of the Written Opinion of the International Searching Authority issued in PCT application No. PCT/FR2020/050336, dated Jun. 12, 2020, 4 pp.

English Translation of the Written Opinion of the International Searching Authority issued in PCT application No. PCT/FR2020/050337, dated Jul. 1, 2020, 4 pp.

Non-Final Rejection dated Oct. 26, 2023 for U.S. Appl. No. 17/435,347, 11 page(s).

* cited by examiner

COLOR AND INFRARED IMAGE SENSOR

CROSS REFERENCE TO RELATED APPLICATIONS

The present patent application claims the priority benefit of French patent application FR19/02157 which is herein incorporated by reference.

FIELD

The present disclosure relates to an image sensor or electronic imager.

BACKGROUND

Image sensors are used in many fields, in particular in electronic devices, due to their miniaturization. Image sensors are present, be it in man-machine interface applications or in image capture applications.

For certain applications, it is desirable to have an image sensor enabling to simultaneously acquire a color image and an infrared image. Such an image sensor is called color and infrared image sensor in the following description. An example of application of a color and infrared image sensor concerns the acquisition of an infrared image of an object having a structured infrared pattern projected thereon. The fields of use of such image sensors particularly are motors vehicles, drones, smart phones, robotics, and augmented reality systems.

The phase during which a pixel collects charges under the action of an incident radiation is called integration phase of the pixel. The integration phase is generally followed by a readout phase during which the quantity of charges collected by the pixels is measured.

A plurality of constraints are to be taken into account for the design of a color and infrared image sensor. First, the resolution of the color images should not be smaller than that obtained with a conventional color image sensor.

Second, for certain applications, it may be desirable for the image sensor to be of global shutter type, that is, implementing an image acquisition method where the beginnings and ends of pixel integration phases are simultaneous. This may in particular apply for the acquisition of an infrared image of an object having a structured infrared pattern projected thereon.

Third, it is desirable for the size of the image sensor pixels to be as small as possible. Fourth, it is desirable for the filling factor of each pixel, which corresponds to the ratio of the surface area, in top view, of the area of the pixel actively taking part in the capture of the incident radiation, to the total surface area, in top view, of the pixel, to be as large as possible.

It may be difficult to design a color and infrared image sensor which fulfils all the previously-described constraints.

SUMMARY

An embodiment overcomes all or part of the disadvantages of the previously-described color and infrared image sensors.

According to an embodiment, the resolution of the color images acquired by the color and infrared image sensor is greater than 2,560 ppi, preferably greater than 8,530 ppi.

According to an embodiment, the method of acquisition of an infrared image is of global shutter type.

According to an embodiment, the size of the color and infrared image sensor pixel is smaller than 10 µm, preferably smaller than 3 µm.

According to an embodiment, the filling factor of each pixel of the color and infrared image sensor is greater than 50%, preferably greater than 80%.

An embodiment provides a color and infrared image sensor comprising a silicon substrate, MOS transistors formed in the substrate and on the substrate, first photodiodes at least partly formed in the substrate, a photosensitive layer covering the substrate, and color filters, the photosensitive layer being interposed between the substrate and the color filters. The image sensor further comprises first and second electrodes on either side of the photosensitive layer and delimiting second photodiodes in the photosensitive layer, the first photodiodes being configured to absorb the electromagnetic waves of the visible spectrum and of a first portion of the infrared spectrum and the photosensitive layer being configured to absorb the electromagnetic waves of the visible spectrum and to give way to the electromagnetic waves of said first portion of the infrared spectrum.

According to an embodiment, the image sensor further comprises an infrared filter, the color filters being interposed between the photosensitive layer and the infrared filter, the infrared filter being configured to give way to the electromagnetic waves of the visible spectrum, to give way to the electromagnetic waves of said first portion of the infrared spectrum, and to block the electromagnetic waves of at least a second portion of the infrared spectrum between the visible spectrum and the first portion of the infrared spectrum.

According to an embodiment, the image sensor further comprises an array of lenses interposed between the photosensitive layer and the infrared filter.

According to an embodiment, the image sensor further comprises, for each pixel of the color image to be acquired, at least first, second, and third sub-pixels, each comprising one of the second photodiodes, one of the first photodiodes, and one of the color filters, the color filters of the first, second, and third sub-pixels giving way to electromagnetic waves in different frequency ranges of the visible spectrum.

According to an embodiment, for each pixel of the color image to be acquired, the second electrode is common to the first, second, and third sub-pixels.

According to an embodiment, the image sensor further comprises, for each pixel of the color image to be acquired, at least one fourth sub-pixel comprising one of the second photodiodes and one of the color filters, the color filter of the fourth sub-pixel being configured to block the electromagnetic waves of the visible spectrum and to give way to electromagnetic waves in a third portion of the infrared spectrum between the visible spectrum and the first portion of the infrared spectrum, the photosensitive layer being configured to absorb electromagnetic waves in said third portion of the infrared spectrum.

According to an embodiment, the image sensor further comprises for each first, second, and third sub-pixel a readout circuit coupled to the second photodiode and to the first photodiode.

According to an embodiment, the readout circuit is configured to transfer first electric charges generated in the first photodiode to a first electrically-conductive track and configured to transfer second charges generated in the second photodiode to the first electrically-conductive track or a second electrically-conductive track.

According to an embodiment, the first photodiodes are arranged in rows and in columns and the readout circuits are configured to control the generation of the first charges during first time intervals simultaneous for all the first photodiodes of the image sensor.

According to an embodiment, the second photodiodes are arranged in rows and in columns and the readout circuits are configured to control the generation of the second charges during second time intervals simultaneous for all the second photodiodes of the image sensor or shifted in time from one row of second photodiodes to the other.

According to an embodiment, the readout circuits are configured to control a first integration phase for the first photodiodes having a first duration and to control a second integration phase for the second photodiodes having a second duration different from the first duration.

According to an embodiment, each readout circuit comprises at least one first follower-assembled MOS transistor, the second photodiode having a first electrode directly coupled to the gate of the first MOS transistor and its second photodiode having a second electrode coupled to the gate of the first MOS transistor or to the gate of a second follower-assembled MOS transistor, via a third MOS transistor.

According to an embodiment, the photosensitive layer is made of organic materials and/or contains quantum dots.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
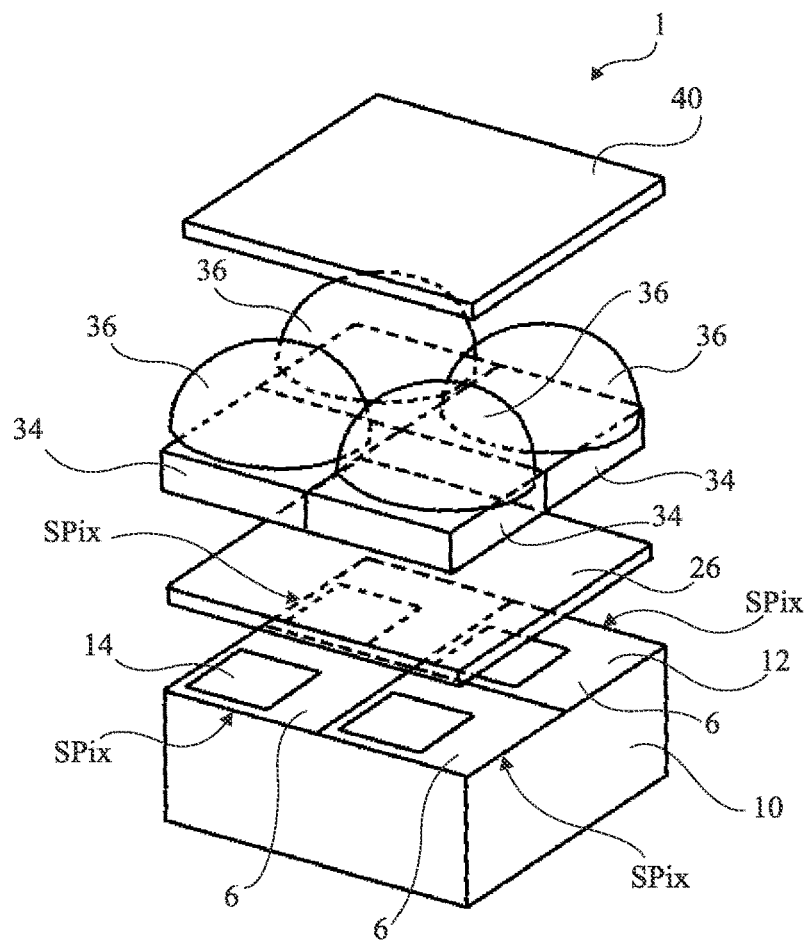
FIG. 1 is a partial simplified exploded perspective view of an embodiment of a color and infrared image sensor.

Like features have been designated by like references in the various figures. In particular, the structural and/or functional features that are common among the various embodiments may have the same references and may dispose identical structural, dimensional and material properties. For clarity, only those steps and elements which are useful to the understanding of the described embodiments have been shown and are detailed. In particular, what use is made of the image sensors described hereafter has not been detailed.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an image sensor as orientated during normal use. Unless specified otherwise, the expressions "around", "approximately", "substantially" and "in the order of" signify within 10%, and preferably within 5%.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, a signal which alternates between a first constant state, for example, a low state, noted "0", and a second constant state, for example, a high state, noted "1", is called "binary signal". The high and low states of different binary signals of a same electronic circuit may be different. In particular, the binary signals may correspond to voltages or to currents which may not be perfectly constant in the high or low state. Further, it is here considered that the terms "insulating" and "conductive" respectively mean "electrically insulating" and "electrically conductive".

The transmittance of a layer corresponds to the ratio of the intensity of the radiation coming out of the layer to the intensity of the radiation entering the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%. In the following description, the refraction index of a material corresponds to the refraction index of the material for the wavelength range of the radiation captured by the image sensor. Unless specified otherwise, the refraction index is considered as substantially constant over the wavelength range of the useful radiation, for example, equal to the average of the refraction index over the wavelength range of the radiation captured by the image sensor.

In the following description, "visible light" designates an electromagnetic radiation having a wavelength in the range from 400 nm to 700 nm and "infrared radiation" designates an electromagnetic radiation having a wavelength in the range from 700 nm to 1 mm. In infrared radiation, one can particularly distinguish near infrared radiation having a wavelength in the range from 700 nm to 1.4 µm.

A pixel of an image corresponds to the unit element of the image captured by an image sensor. When the optoelectronic device is a color image sensor, it generally comprises, for each pixel of the color image to be acquired, at least three components which each acquire a light radiation substantially in a single color, that is, in a wavelength range below 100 nm (for example, red, green, and blue). Each component may particularly comprise at least one photodetector.

Figure 2:
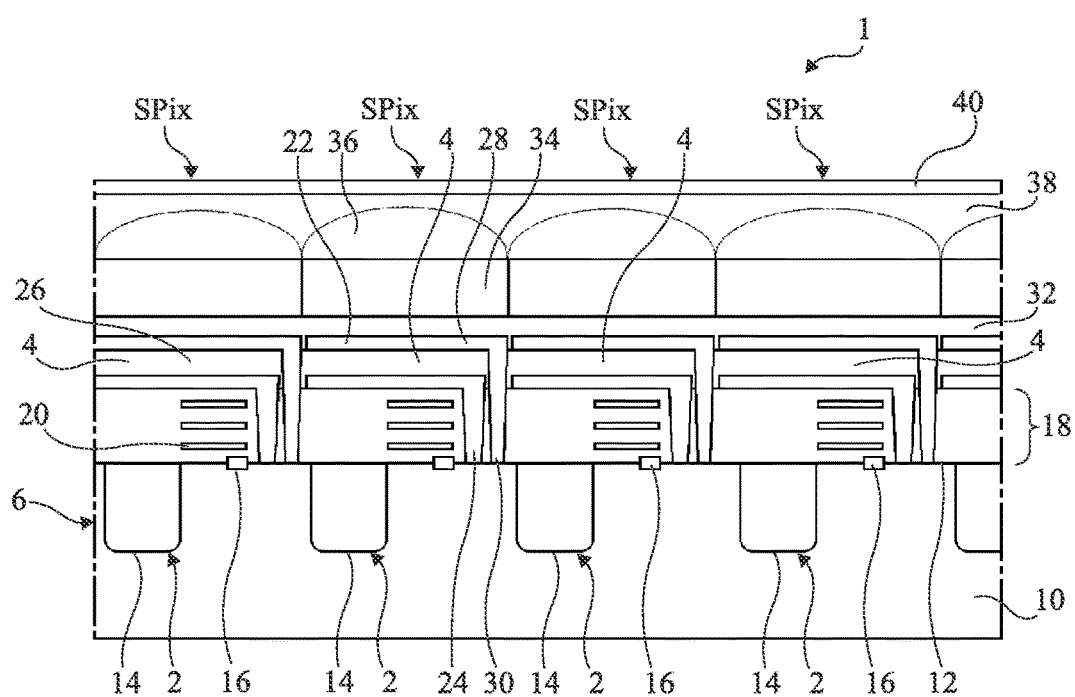
FIG. 2 is a partial simplified cross-section view of the image sensor of FIG. 1 illustrating an embodiment of the electrodes of the image sensor.

FIG. 1 is a partial simplified exploded perspective view and FIG. 2 is a partial simplified cross-section view of an embodiment of a color and infrared image sensor 1. Image sensor 1 comprises an array of first photon sensors 2, also called photodetectors, capable of capturing an infrared image, and an array of second photodetectors 4, capable of capturing a color image. The arrays of photodetectors 2 and 4 are associated with an array of readout circuits 6 measuring the signals captured by photodetectors 2 and 4. Readout circuit means an assembly of transistors for reading out, addressing, and controlling the pixel or sub-pixel defined by the corresponding photodetectors 2 and 4.

In image sensor 1, the array of color photodetectors 4 covers the array of infrared photodetectors 2. For each pixel of the color image to be acquired, call sub-pixel SPix of image sensor 1 the portion of image sensor 1 comprising photodetector 4 enabling to acquire the light radiation in a limited portion of the visible radiation of the image to be acquired.

Four sub-pixels SPix have been shown in FIGS. 1 and 2. For clarity, only certain elements of image sensor 1 present in FIG. 2 are shown in FIG. 1. Image sensor 1 comprises, from bottom to top in FIG. 2:
- a semiconductor substrate 10 comprising an upper surface 12, preferably planar;
- for each sub-pixel SPix, at least one doped semiconductor region 14 formed in substrate 12 and forming part of infrared photodiode 2;
- electronic components 16 of readout circuits 6 located in substrate 10 and/or on surface 12, a single component 16 being shown per sub-pixel SPix in FIG. 2;
- a stack 18 of insulating layers covering surface 12, conductive tracks 20 being located on stack 18 and between the insulating layers of stack 18;
- for each sub-pixel SPix, an electrode 22 resting on stack 18 and coupled to substrate 10, to one of components 16, or to one of the conductive tracks 20 by a conductive via 24;
- an active layer 26 covering all the electrodes 22 and covering stack 18 between electrodes 22;
- for each sub-pixel SPix, an electrode 28 resting on active layer 26 and coupled to substrate 10, to one of components 16, or to one of conductive tracks 20 by a conductive via 30;
- an insulating layer 32 covering all the electrodes 28 and covering the active layer 26 between electrodes 28;
- for each sub-pixel SPix, a color filter 34 covering insulating layer 32;
- for each sub-pixel SPix, a microlens 36 covering color filter 34;
- an insulating layer 38 covering microlenses 36; and
- a filter 40 covering insulating layer 36.

Sub-pixels SPix may be distributed in rows and in columns. In the present embodiment, each sub-pixel SPix has, in a direction perpendicular to surface 12, a square or rectangular base with a side length varying from 0.1 μm to 100 μm, for example, equal to approximately 3 μm. However, each sub-pixel SPix may have a base with a different shape, for example, hexagonal.

In the present embodiment, active layer 26 is common to all the sub-pixels SPix of image sensor 1. The active area of each color photodetector 4 corresponds to the area where most of the incident radiation is absorbed and converted into an electric signal by color photodetector 4 and substantially corresponds to the portion of the active layer 26 located between lower electrode 22 and upper electrode 28.

According to an embodiment, each infrared photodetector 2 is capable of capturing an electromagnetic radiation in a wavelength range in the range from 400 nm to 1,100 nm.

According to an embodiment, active layer 26 is capable of capturing an electromagnetic radiation in a wavelength range in the range from 400 nm to 700 nm, that is, of only absorbing visible light. According to another embodiment, active layer 26 is capable of capturing an electromagnetic radiation in a wavelength range in the range from 400 nm to 920 nm, that is, visible light and a portion of near infrared. The photodetectors may be made of organic materials. The photodetectors may correspond to organic photodiodes (OPD) or to organic photoresistors. In the following description, it is considered that the photodetectors correspond to photodiodes.

Filter 40 is capable of giving way to visible light, of giving way to the portion of the infrared radiation over the infrared wavelength range of interest for the acquisition of the infrared image, and of blocking the rest of the incident radiation, and particularly the rest of the infrared radiation outside of the infrared wavelength range of interest. According to an embodiment, the infrared wavelength range of interest may correspond to a 50 nm range centered on the expected wavelength of the infrared radiation, for example, centered on the 940 nm wavelength or centered on the 850 nm wavelength. Filter 40 may be an interference filter and/or comprise absorbing and/or reflective layers.

Color filters 34 may correspond to colored resin blocks. Each color filter 34 is capable of giving way to the infrared radiation, for example, at a wavelength between 700 nm and 1 mm and, for at least some of the color filters, of giving way to a wavelength range of visible light. For each pixel of the color image to be acquired, the image sensor may comprise a sub-pixel SPix having its color filter 34 only capable of giving way to blue light, for example, in the wavelength range from 430 nm to 490 nm, a sub-pixel SPix having its color filter 34 only capable of giving way to green light, for example, in the wavelength range from 510 nm to 570 nm, and a sub-pixel SPix having its color filter 34 only capable of giving way to red light, for example, in the wavelength range from 600 nm to 720 nm.

According to an embodiment, active layer 26 is capable of capturing an electromagnetic radiation in a wavelength range in the range from 400 nm to 700 nm, that is, of only absorbing visible light. Color filters 34 may then be distributed in a Bayer array. Thereby, for each sub-pixel SPix, the color photodetector 4 of the sub-pixel only captures the portion of the visible light having crossed the color filter 34 of the sub-pixel.

According to another embodiment, active layer 26 is capable of capturing an electromagnetic radiation in a wavelength range in the range from 400 nm to 920 nm, that is, visible light and a portion of near infrared. In this case, one of color filters 34 is capable of only giving way to infrared radiation and of blocking visible light. One of the color photodiodes 4 then plays the role of a photodiode for near infrared. This may be advantageous for the acquisition of color images, particularly in case of a low luminosity. The infrared radiation captured by infrared photodiodes 2 corresponds to a wavelength range different from the infrared radiation captured by color photodiode 4 playing the role of a photodiode for near infrared.

According to an embodiment, semiconductor substrate is made of silicon, preferably, of single crystal silicon. The substrate may be of silicon-on-insulator or SOI type comprising a stack of a silicon layer on an insulating layer. According to an embodiment, electronic components 16 comprise transistors, particularly metal-oxide gate field-effect transistors, also called MOS transistors. Infrared photodiodes 2 are inorganic photodiodes, preferably made of silicon. Each infrared photodiode 2 comprises at least the doped silicon region 14 which extends in substrate 10 from surface 12. According to an embodiment, substrate 10 is non-doped or lightly doped with a first conductivity type, for example, type P, and each region 14 is a doped region, of the conductivity type opposite to that of substrate 10, for example, type N. The depth of each region 14, measured from surface 12, may be in the range from 1 μm to 12 μm. Infrared photodiode 2 may correspond to a pinned photodiode. Examples of pinned photodiodes are particularly described in U.S. Pat. No. 6,677,656. These for example are photodiodes separated by deep insulating trenches to ease the collection of the charges generated in depth due to the near infrared radiation.

Conductive tracks 20, conductive vias 24, 30 may be made of a metallic material, for example, silver (Ag), aluminum (Al), gold (Au), copper (Cu), nickel (Ni), titanium (Ti), and chromium (Cr). Conductive tracks 20 and conductive vias 24, 30 may have a monolayer or multilayer structure. Each insulating layer of stack 18 may be made of an inorganic material, for example, made of silicon oxide ($SiO_2$) or a silicon nitride (SiN).

Each electrode 22, 28 is at least partially transparent to the light radiation that it receives. Each electrode 22, 28 may be made of a transparent conductive material, for example, of transparent conductive oxide or TCO, of carbon nanotubes, of graphene, of a conductive polymer, of a metal, or of a mixture or an alloy of at least two of these compounds. Each electrode 22, 28 may have a monolayer or multilayer structure.

Examples of TCOs capable of forming each electrode 22, 28 are indium tin oxide (ITO), aluminum zinc oxide (AZO), and gallium zinc oxide (GZO), titanium nitride (TiN), molybdenum oxide ($MoO_3$), and tungsten oxide ($WO_3$). An example of a conductive polymer capable of forming each electrode 22, 28 is the polymer known as PEDOT:PSS, which is a mixture of poly(3,4)-ethylenedioxythiophene and of sodium poly(styrene sulfonate), and polyaniline, also called PAni. Examples of metals capable of forming each electrode 22, 28 are silver, aluminum, gold, copper, nickel, titanium, and chromium. An example of a multilayer structure capable of forming each electrode 22, 28 is a multilayer AZO and silver structure of AZO/Ag/AZO type.

The thickness of each electrode 22, 28 may be in the range from 10 nm to 5 μm, for example, in the order of 30 nm. In the case where electrode 22, 28 is metallic, the thickness of electrode 22, 28 is smaller than or equal to 20 nm, preferably smaller than or equal to 10 nm.

Each insulating layer 32, 38 may be made of a fluorinated polymer, particularly the fluorinated polymer commercialized under trade name Cytop by Bellex, of polyvinylpyrrolidone (PVP), of polymethyl methacrylate (PMMA), of polystyrene (PS), of parylene, of polyimide (PI), of acrylonitrile butadiene styrene (ABS), of poly(ethylene terephtalate) (PET), of poly(ethylene napthalate) (PEN), of cyclo olefin polymer (COP), en polydimethylsiloxane (PDMS), of a photolithography resin, of epoxy resin, of acrylate resin, or of a mixture of at least two of these compounds. As a variation, each insulating layer 32, 38 may be made of an inorganic dielectric, particularly made of silicon nitride, of silicon oxide, or of aluminum oxide ($Al_2O_3$). The aluminum oxide may be deposited by atomic layer deposition (ALD). The maximum thickness of each insulating layer 32, 38 may be in the range from 50 nm to 2 μm, for example, in the order of 100 nm.

Active layer 26 may comprise small molecules, oligomers, or polymers. These may be organic or inorganic materials, particularly quantum dots. Active layer 26 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of active layer 26 may be in the range from 50 nm to 2 μm, for example, in the order of 200 nm.

Example of P-type semiconductor polymers capable of forming active layer 26 are poly(3-hexylthiophene) (P3HT), poly[N-9'-heptadecanyl-2,7-carbazole-alt-5,5-(4,7-di-2-thienyl-2',1',3'-benzothiadiazole)] (PCDTBT), poly[(4,8-bis-(2-ethylhexyloxy)-benzo[1,2-b;4,5-b'] dithiophene)-2,6-diyl-alt-(4-(2-ethylhexanoyl)-thieno[3,4-b] thiophene))-2,6-diyl] (PBDTTT-C), poly[2-methoxy-5-(2-ethyl-hexyloxy)-1,4-phenylene-vinylene] (MEH-PPV), or poly[2,6-(4,4-bis-(2-ethylhexyl)-4H-cyclopenta[2,1-b;3,4-b']dithiophene)-alt-4,7(2,1,3-benzothiadiazole)] (PCPDTBT).

Examples of N-type semiconductor materials capable of forming active layer 26 are fullerenes, particularly C60, [6,6]-phenyl-$C_{61}$-methyl butanoate ([60]PCBM), [6,6]-phenyl-$C_{71}$-methyl butanoate ([70]PCBM), perylene diimide, zinc oxide (ZnO), or nanocrystals enabling to form quantum dots.

Active layer 26 may be interposed between first and second interface layers, not shown. According to the photodiode polarization mode, the interface layers ease the collection, the injection, or the blocking of charges from the electrodes into active layer 26. The thickness of each interface layer is preferably in the range from 0.1 nm to 1 μm. The first interface layer enables to align the work function of the adjacent electrode with the electronic affinity of the acceptor material used in active layer 26. The first interface layer may be made of cesium carbonate ($CSCO_3$), of metal oxide, particularly of zinc oxide (ZnO), or of a mixture of at least two of these compounds. The first interface layer may comprise a self-assembled monomolecular layer or a polymer, for example, (polyethyleneimine, ethoxylated polyethyleneimine, poly[(9,9-bis(3'-(N,N-dimethylamino)propyl)-2,7-fluorene)-alt-2,7-(9,9-dioctylfluorene)]. The second interface layer enables to align the work function of the other electrode with the ionizing potential of the donor material used in active layer 26. The second interface layer may be made of copper oxide (CuO), of nickel oxide (NiO), of vanadium oxide ($V_2O_5$), of magnesium oxide (MgO), of tungsten oxide ($WO_3$), of molybdenum oxide ($MoO_3$), of PEDOT:PSS, or of a mixture of at least two of these compounds.

Microlenses 36 have a micrometer-range size. In the present embodiment, each sub-pixel SPix comprises a microlens 36. As a variation, each microlens 36 may be replaced with another type of micrometer-range optical element, particularly a micrometer-range Fresnel lens, a micrometer-range index gradient lens, or a micrometer-range diffraction grating. Microlenses 36 are converging lenses each having a focal distance f in the range from 1 μm to 100 μm, preferably from 1 μm to 10 μm. According to an embodiment, all the microlenses 36 are substantially identical.

Microlenses 36 may be made of silica, of PMMA, of a positive photosensitive resin, of PET, of PEN, of COP, of PDMS/silicone, or of epoxy resin. Microlenses 36 may be formed by flowing of resist blocks. Microlenses 36 may further be formed by molding on a layer of PET, PEN, COP, PDMS/silicone or epoxy resin.

According to an embodiment, layer 38 is a layer which follows the shape of microlenses 36. Layer 38 may be obtained from an optically clear adhesive (OCA), particularly a liquid optically clear adhesive (LOCA), or a material with a low refraction index, or an epoxy/acrylate glue, or a film of a gas or of a gaseous mixture, for example, air. Preferably, when layer 38 follows the shape of microlenses 36, layer 38 is made of a material having a low refraction index, lower than that of the material of microlenses 36. Layer 38 may be made of a filling material which is a non-adhesive transparent material. According to another embodiment, layer 38 corresponds to a film which is applied against microlens array 36, for example, an OCA film. In this case, the contact area between layer 38 and microlenses 36 may be decreased, for example, limited to the top of the microlenses. Layer 38 may then be formed of a material having a higher refraction index than in the case where layer 38 follows the shape of microlenses 36. According to another embodiment, layer 38 corresponds to an OCA film which is applied against microlens array 36, the adhesive having properties which enable film 38 to completely or substantially completely follow the surface of the microlenses.

According to the considered materials, the method of forming at least certain layers of image sensor 1 may correspond to a so-called additive process, for example, by direct printing of the material forming the organic layers at the desired locations, particularly in sol-gel form, for example, by inkjet printing, photogravure, silk-screening, flexography, spray coating, or drop casting. According to the considered materials, the method of forming the layers of image sensor 1 may correspond to a so-called subtractive method, where the material forming the organic layers is deposited all over the structure and where the non-used portions are then removed, for example, by photolithography or laser ablation. Further, according to the considered layers and materials, the material forming active layer 26 is deposited over the entire structure and is not partially removed, the pitch of the photodiodes being then obtained by the position of electrodes 22 and 28. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. When the layers are metallic, the metal is for example deposited by evaporation or by cathode sputtering over the entire support and the metal layers are delimited by etching.

Advantageously, at least some of the layers of image sensor 1 may be formed by printing techniques. The materials of the previously-described layers may be deposited in liquid form, for example, in the form of conductive and semiconductor inks by means of inkjet printers. "Materials in liquid form" here also designates gel materials capable of being deposited by printing techniques. Anneal steps may be provided between the depositions of the different layers, but it is possible for the anneal temperatures not to exceed 150° C., and the deposition and the possible anneals may be carried out at the atmospheric pressure.

Figure 3:
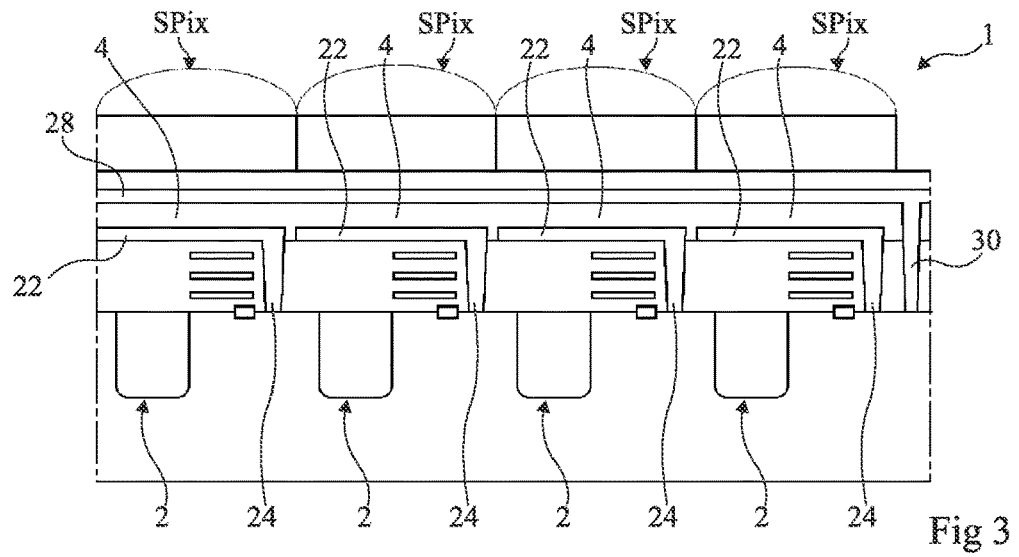
FIG. 3 is a partial simplified cross-section view of the image sensor of FIG. 1 illustrating another embodiment of the electrodes.

FIG. 3 is a cross-section view of image sensor 1 illustrating another embodiment of a layout of the electrodes of color photodiodes 4. In the present embodiment, electrode 28 is common to each color photodiode 4 of the pixel. Further, electrode 28 may be common to all the pixels of a same row of pixels. Via 30 may then not be present for each sub-pixel of the pixel and may be provided in areas which do not correspond to sub-pixels, for example, at the pixel periphery. Only electrode 22 is delimited for each sub-pixel SPix.

Figure 4:
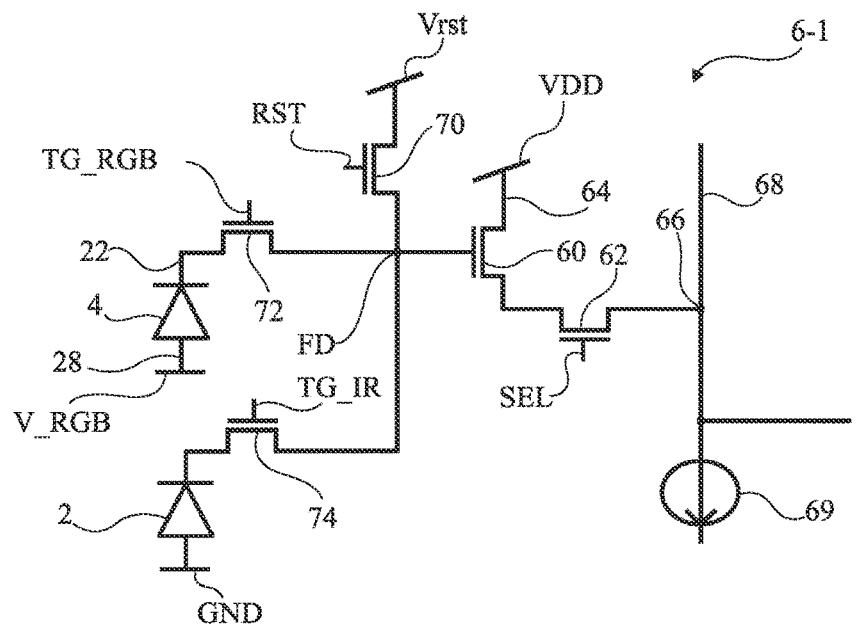
FIG. 4 is an electric diagram of an embodiment of a readout circuit of a sub-pixel of the image sensor of FIG. 1.

FIG. 4 shows the simplified electric diagram of an embodiment of the readout circuit 6-1 associated with the color photodiode 4 and with the infrared photodiode 2 of a sub-pixel SPix.

Readout circuit 6-1 comprises a MOS transistor in a follower assembly 60, in series with a selection MOS transistor 62, between two terminals 64, 66. Terminal 64 is coupled to a source of a high reference potential VDD in the case where the transistors forming the readout circuits are N-channel MOS transistors, or of a low reference potential, for example, the ground, in the case where the transistors forming the readout circuit are P-channel MOS transistors. Terminal 66 is coupled to a conductive track 68. Conductive track 68 may be coupled to all the sub-pixels of a same column and may be coupled to a current source 69 which does not belong to sub-pixel readout circuit 6-1. The gate of transistor 62 is intended to receive a sub-pixel selection signal SEL. The gate of transistor 60 is coupled to a node FD. Node FD is coupled, by a MOS reset transistor 70, to a terminal of application of a reset potential Vrst, which potential may be VDD. The gate of transistor 70 is intended to receive a signal RST for controlling the resetting of the sub-pixel, particularly enabling to reset node FD substantially to potential Vrst.

Node FD is coupled to the cathode electrode 22 of the color photodiode 4 of the considered sub-pixel via a MOS transfer transistor 72. The anode electrode 28 of the color photodiode 4 of the sub-pixel is coupled to a source of a reference potential V_RGB. The gate of transistor 72 is intended to receive a signal TG_RGB for selecting the color photodiode 4 of the sub-pixel. The gate of transistor 60 is further coupled to the cathode electrode of the infrared photodiode 2 of the considered sub-pixel via a MOS transfer transistor 74. The anode electrode of the infrared photodiode 2 of the sub-pixel is coupled to a source of a low reference potential GND, for example, the ground. The gate of transistor 74 is intended to receive a signal TG_IR for selecting the infrared photodiode 2 of the sub-pixel. In the present embodiment, the readout circuit 6-1 shown in FIG. 4 comprising five MOS transistors is provided for each sub-pixel. For each row of sub-pixels, signals SEL, TR_RGB, TR_IR, RST and potential V_RGB may be transmitted to all the sub-pixels in the row. Call V_FD the potential at node FD referenced to low reference potential GND. A capacitor, not shown, having an electrode coupled to node FD and having its other electrode coupled to the source of low reference potential GND may be provided. As a variation, the role of this capacitor may be fulfilled by the stray capacitances present at node FD.

Figure 5:
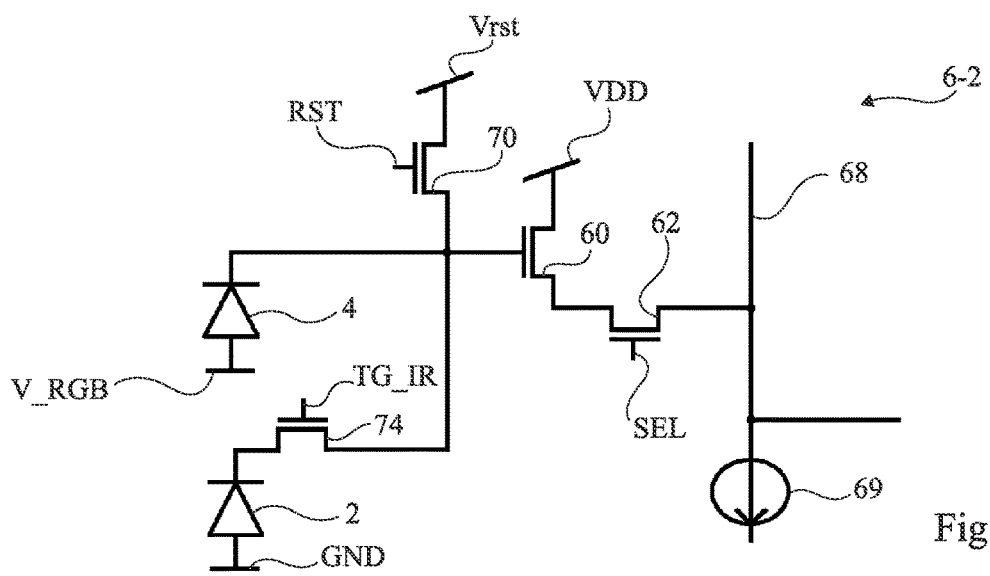
FIG. 5 is an electric diagram of another embodiment of the readout circuit.

FIG. 5 shows the simplified electric diagram of another embodiment of the readout circuit 6-2 associated with the color photodiode 4 and with the infrared photodiode 2 of a sub-pixel. Readout circuit 6-2 comprises all the elements of the readout circuit 6-1 shown in FIG. 4, with the difference that transfer transistor 72 is not present, cathode electrode 22 being directly coupled to the gate of follower-assembled transistor 60.

Figure 6:
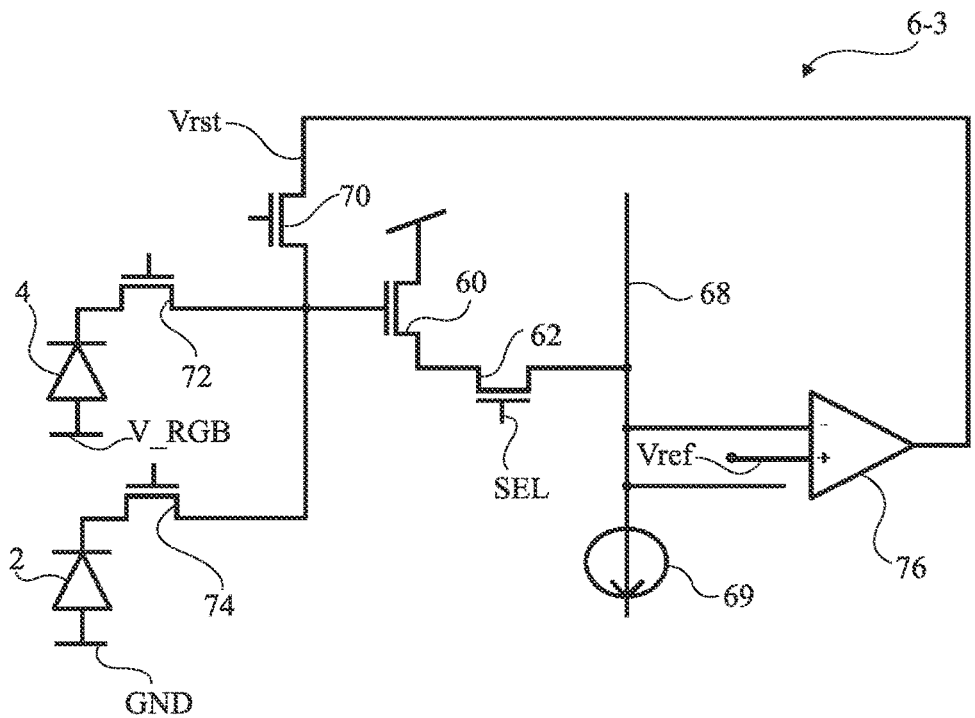
FIG. 6 is an electric diagram of another embodiment of the readout circuit.

FIG. 6 shows the simplified electric diagram of another embodiment of the readout circuit 6-3 associated with the color photodiode 4 and with the infrared photodiode 2 of a sub-pixel. Readout circuit 6-3 comprises all the elements of the readout circuit 6-1 shown in FIG. 4 and further comprises, for each conductive track 68, an operational amplifier 76 having its inverting input (−) coupled to conductive track 68, having its non-inverting input (+) coupled to a source of a reference potential Vref, and having its output delivering the potential Vrst applied to one of the power terminals of reset transistor 70. Operational amplifier 76 may be coupled to all the reset transistors 70 of the sub-pixels coupled to conductive track 68. Operational amplifier 76 forms a feedback loop which enables to decrease, or even to suppress, the thermal noise of reset transistor 70, such noise being usually suppressed by a readout method implementing a correlated double sampling (CDS).

Figure 7:
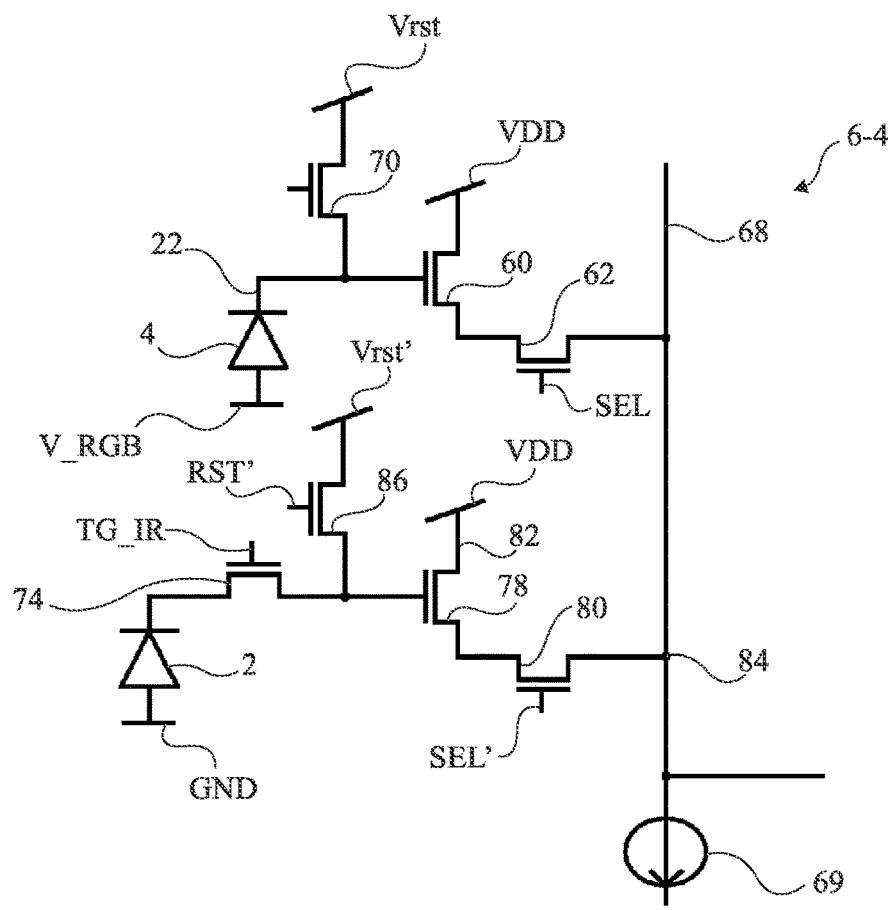
FIG. 7 is an electric diagram of another embodiment of the readout circuit.

FIG. 7 shows the simplified electric diagram of another embodiment of the readout circuit 6-4 associated with the color photodiode 4 and with the infrared photodiode 2 of a sub-pixel. Readout circuit 6-4 comprises all the elements of the readout circuit 6-1 shown in FIG. 4, with the difference that MOS transfer transistor 72 is not present, that the cathode electrode 22 of color photodiode 4 is connected to the gate of follower-assembled transistor 60, and that readout circuit 6-4 further comprises a MOS transistor in a follower assembly 78, in series with a MOS selection transistor 80, between two terminals 82, 84. Terminal 82 is coupled to the source of high reference potential VDD. Terminal 84 is coupled to conductive track 68. The gate of transistor 80 is intended to receive a signal SEL' of selection of infrared photodiode 2. The gate of transistor 78 is coupled, by a MOS reset transistor 86, to a terminal of application of reset potential Vrst. The gate of transistor 86 is intended to receive a signal RST' for controlling the resetting of infrared photodiode 2 enabling to recharge photodiode 2 by applying a potential Vrst to the cathode of the infrared photodiode. The gate of transistor 78 is coupled to transfer transistor 74.

Figure 8:
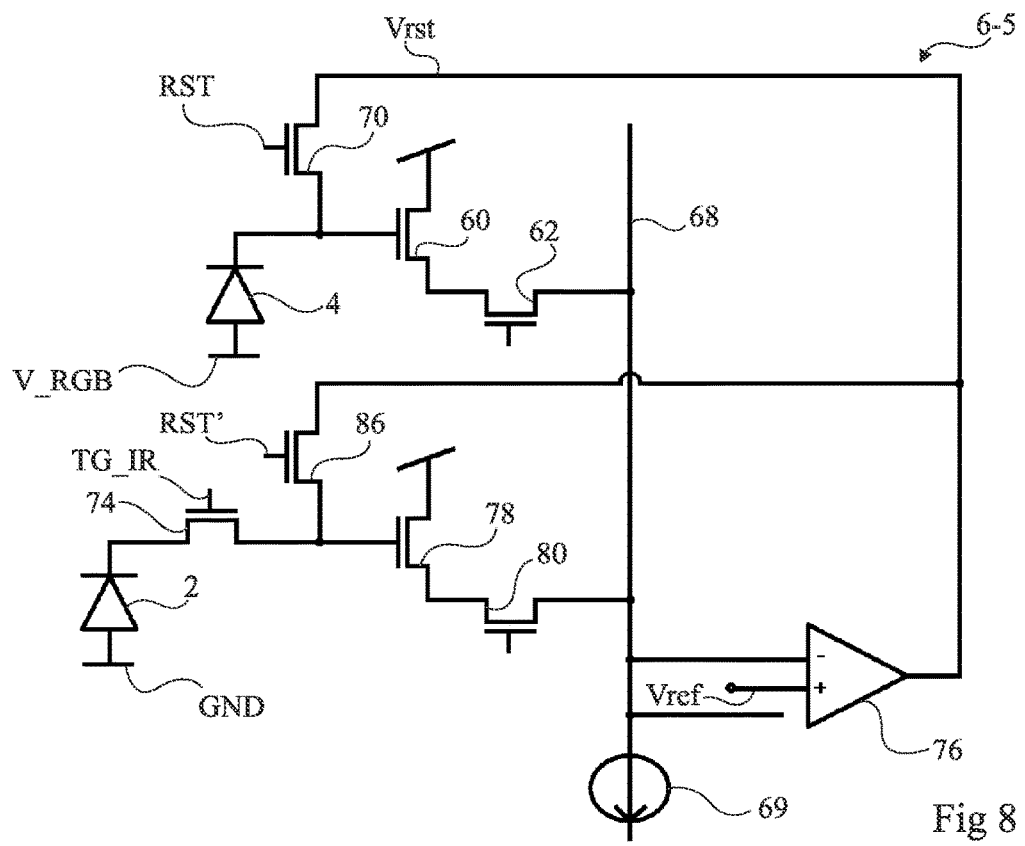
FIG. 8 is an electric diagram of another embodiment of the readout circuit.

FIG. 8 shows the simplified electric diagram of another embodiment of the readout circuit 6-5 associated with the color photodiode 4 and with the infrared photodiode 2 of a sub-pixel. Readout circuit 6-5 comprises all the elements of the readout circuit 6-4 shown in FIG. 7 and further comprises the operational amplifier 76 of the readout circuit 6-3 shown in FIG. 6 having its inverting input (−) coupled to conductive track 68, having its non-inverting input (+) coupled to the source of a reference potential Vref, and having its output delivering the potential Vrst applied to one of the power terminals of reset transistors 70 and 86.

Figure 9:
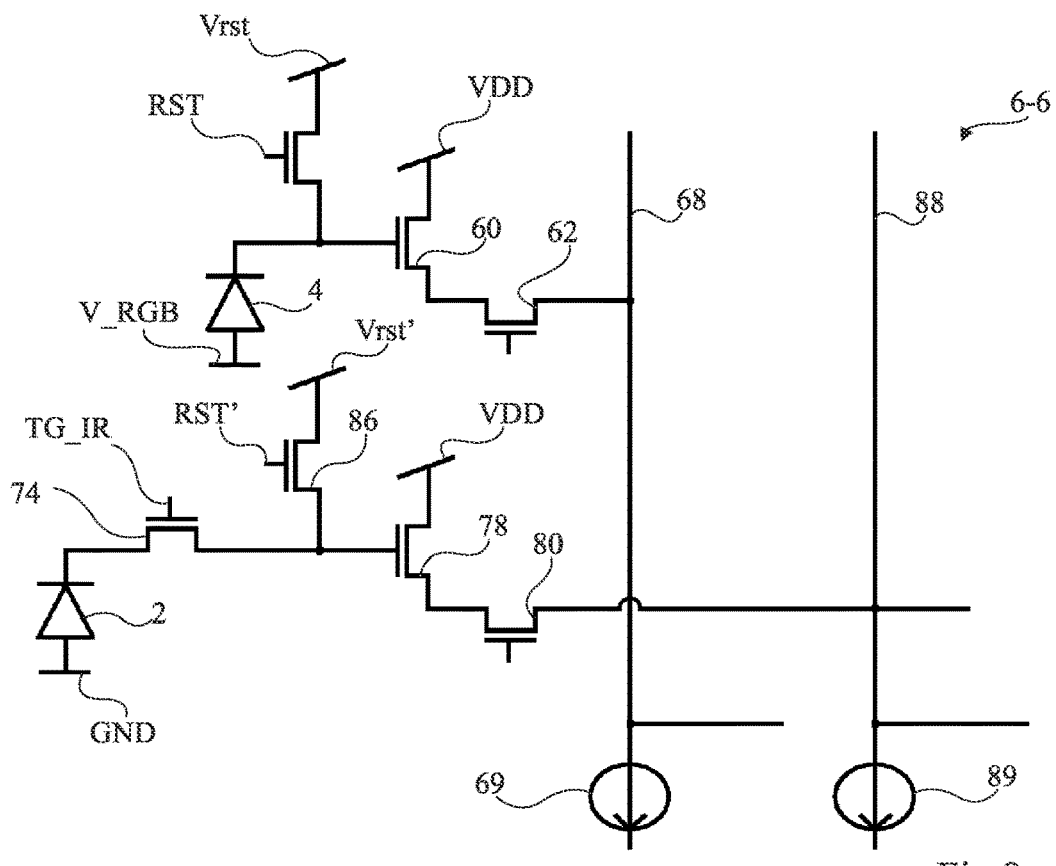
FIG. 9 is an electric diagram of another embodiment of the readout circuit.

FIG. 9 shows the simplified electric diagram of another embodiment of the readout circuit 6-6 associated with the color photodiode 4 and with the infrared photodiode 2 of a sub-pixel. Readout circuit 6-6 comprises all the elements of the readout circuit 6-4 shown in FIG. 7, with the difference that selection transistor 80 is coupled to a conductive track 88, different from conductive track 68, and which is coupled to a current source 89. In the present embodiment, the color sub-pixels and the infrared sub-pixels are thus not coupled in a column. This enables to implement readout methods differing, in particular, by the durations of the successive steps of the method, for color pixels and infrared pixels.

Generally, reset potentials Vrst, Vrst' may be common to all pixels. Potential Vrst is then equal to potential Vrst'. As a variation, the reset potentials may be differentiated according to the column from which the corresponding pixels are read.

Figure 10:
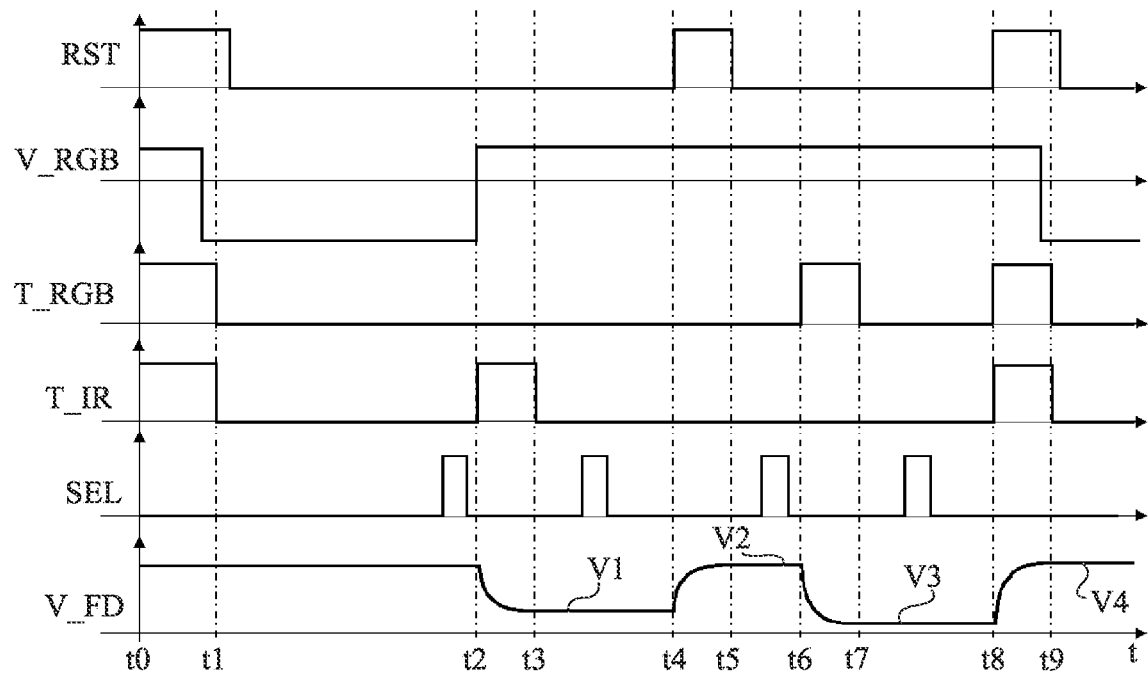
FIG. 10 is a timing diagram of signals of an embodiment of an operating method of the image sensor having the readout circuit of FIG. 4.

FIG. 10 is a timing diagram of binary signals RST, TG_IR, TG_RGB, and SEL, and of potentials V_RGB, and V_FD during an embodiment of a method of operation of the image sensor 6-1 shown in FIG. 4. Call t0 to t9 successive times of an operating cycle. The timing diagram has been established by considering that the MOS transistors of readout circuit 6-1 are N-channel transistors.

At time t0, signal SEL is in the low state so that selection transistor 62 is off. The cycle comprises a reset phase. For this purpose, signal RST is in the high state so that reset transistor 70 is conductive. Signal TG_IR is in the high state so that transfer transistor 74 is conductive. The charges accumulated in infrared photodiode 2 are then discharged towards the source of potential Vrst. Similarly, signal TG_RGB is in the high state so that transfer transistor 72 is conductive. Color photodiode 4 is charged by injecting charges via potential source Vrst.

Just before time t1, potential V_RGB is set to a low level. At time t1, which marks the beginning of a new cycle, signal TG_IR is set to the low state so that transfer transistor 74 is turned off and signal TG_RGB is set to the low state so that transfer transistor 72 is turned off. An integration phase then starts, during which charges are generated in photodiodes 2 and 4. Just after time t1, signal RST is set to the low state so that reset transistor 70 is turned off. Potential V_FD is then set to a first value V1. Between times t1 and t2, signal SEL is temporarily set to a high state, so that the potential of conductive track 68 reaches a value representative of V1, which is stored.

At time t2, potential V_RGB is set to a high level, which stops the charge collection in color photodiode 4. Between times t2 and t3, signal TG_IR is set to the high state so that transfer transistor 74 is conductive. The charges stored in infrared photodiode 2 are then transferred to node FD, having its potential V_FD decreasing to a value V2. Between times t3 and t4, signal SEL is temporarily set to the high state, so that the potential of conductive track 68 reaches a value representative of V2, which is stored. The difference between values V2 and V1 is representative of the quantity of charges collected in infrared photodiode 2 during the integration phase.

Between times t4 and t5, signal RST is set to the high state so that reset transistor 70 is conductive. Potential V_FD then substantially stabilizes at a value V3. Between times t5 and t6, signal SEL is temporarily set to the high state, so that the potential of conductive track 68 reaches a value representative of V3, which is stored. Between times t6 and t7, signal TG_RGB is set to the high state so that transfer transistor 72 is conductive. The charges collected in color photodiode 4 are then transferred to node FD, which has its potential V_FD decreasing to a value V4. Between times t7 and t8, signal SEL is temporarily set to the high state, so that the potential of conductive track 68 reaches a value representative of V4, which is stored. The difference between values V4 and V3 is representative of the quantity of charges stored in color photodiode 4 during the integration phase. Time t9 marks the end of the cycle and corresponds to the time t1 of the next cycle. In the present embodiment, the duration of the integration phase of infrared photodiode 2 is controlled by transfer transistor 74 while the duration of the integration phase of color photodiode 4 is controlled by potential V_RGB. In the present embodiment, the integration phase of color photodiode 4 has the same duration as the integration phase of infrared photodiode 2.

The present embodiment advantageously enables to carry out a readout method of global shutter type for the acquisition of color images, where the integration phases of all the color photodiodes are simultaneously carried out, and a readout method of global shutter type for the acquisition of the infrared image, where the integration phases of all the color photodiodes are simultaneously carried out.

Figure 11:
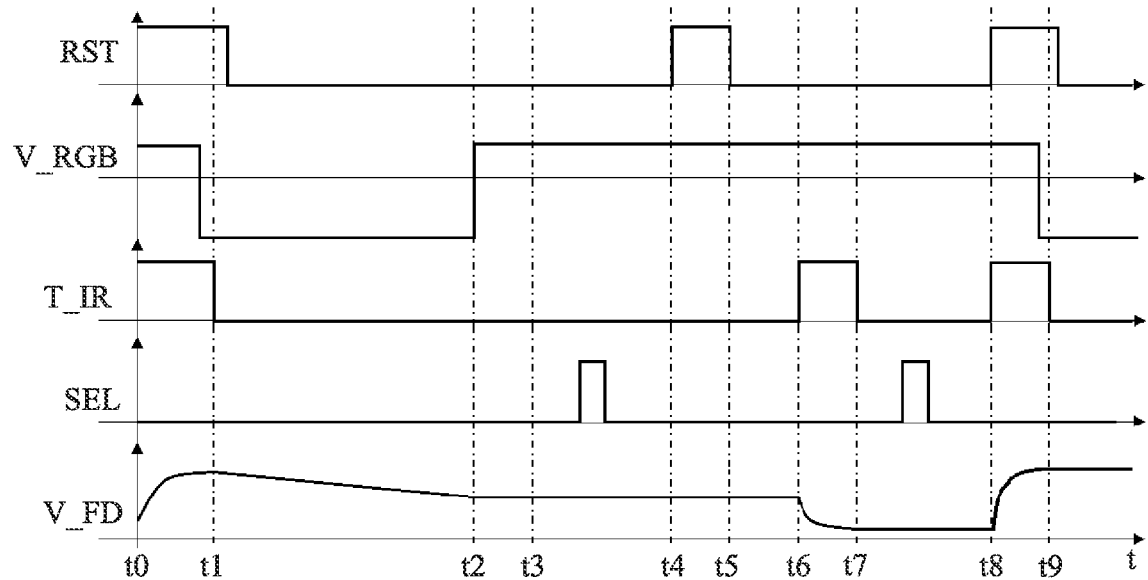
FIG. 11 is a timing diagram of signals of another embodiment of an operating method of the image sensor having the readout circuit of FIG. 4.

FIG. 11 is a timing diagram of binary signals RST, TG_IR, TG_RGB, and SEL, and of potentials V_RGB, and V_FD during another embodiment of a method of operation of the image sensor 6-1 shown in FIG. 5. As compared with the timing diagram shown in FIG. 10, the signal T_IR in FIG. 11 varies like signal T_RGB in FIG. 10 and signal T_RGB is not present in FIG. 11. In the present embodiment, the duration of the integration phase of infrared photodiode 2 is controlled by transfer transistor 74 while the duration of the integration phase of color photodiode 4 is controlled by potential V_RGB. The reading is thus carried out in two steps. A first readout step is carried out between times t3 and t4 where the value of color photodiode 4 is read out and a second readout step is carried out between times t7 and t8, where the sum of the value of color photodiode 4 and of the value of infrared photodiode is read out. The value of infrared photodiode 2 is obtained by an operation of subtraction of the two read values. In the present embodiment, the integration phase of color photodiode 4 is shorter than the integration phase of infrared photodiode 2. The present embodiment advantageously enables to carry out a global shutter type readout method for the acquisition of the color image, where the integration phases of all the color photodiodes are carried out simultaneously, and a global shutter type readout method for the acquisition of the infrared image, where the integration phases of all the infrared photodiodes are carried out simultaneously.

Figure 12:
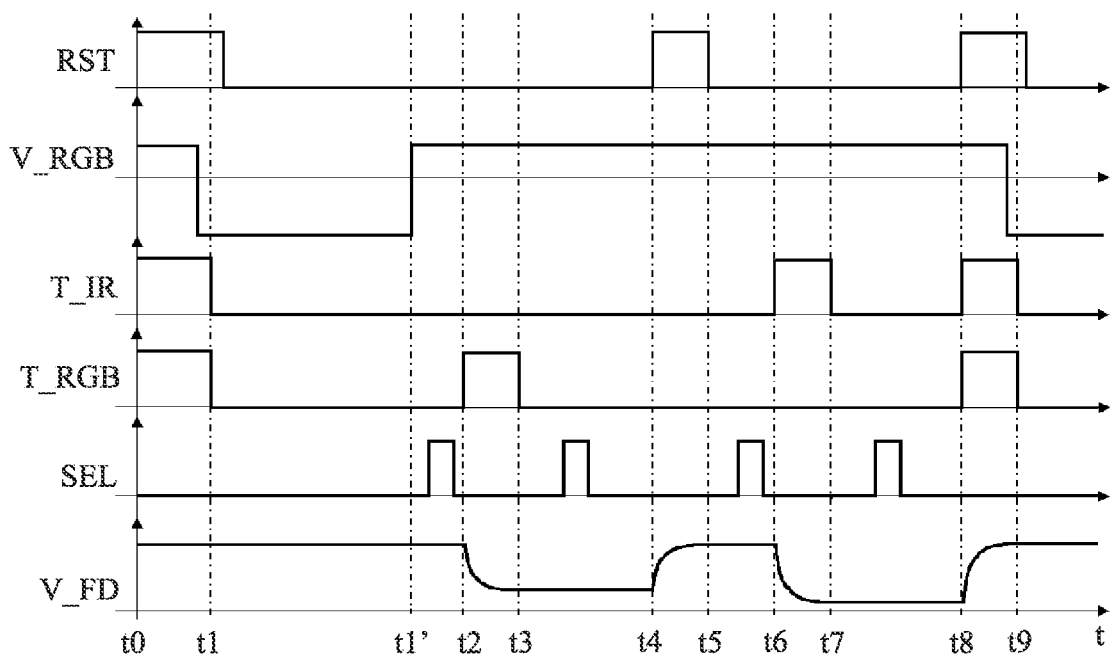
FIG. 12 is a timing diagram of signals of an embodiment of an operating method of the image sensor having the readout circuit of FIG. 9.

FIG. 12 is a timing diagram of binary signals RST, TG_IR, TG_RGB, and SEL, and of potentials V_RGB and V_FD during another embodiment of a method of operation of the image sensor 6-1 shown in FIG. 4. The present operating cycle comprises the same succession of phases as the operating cycle illustrated in FIG. 10, with the difference that potential V_RGB remains in the low state until a time t1', in the present embodiment between times t1 and t2.

In the present embodiment, for each sub-pixel, the integration phase of infrared photodiode 2 extends from time t1 to time t2 and the integration phase of color photodiode 4 extends from time t1 to time t1'. The present embodiment enables the duration of the integration phase of the infrared photodiode to be different from the duration of the color photodiode integration phase. Further, the present embodiment advantageously enables to carry out a readout method of global shutter type for the acquisition of the color image and a readout method of global shutter type for the acquisition of the infrared image.

Figure 13:
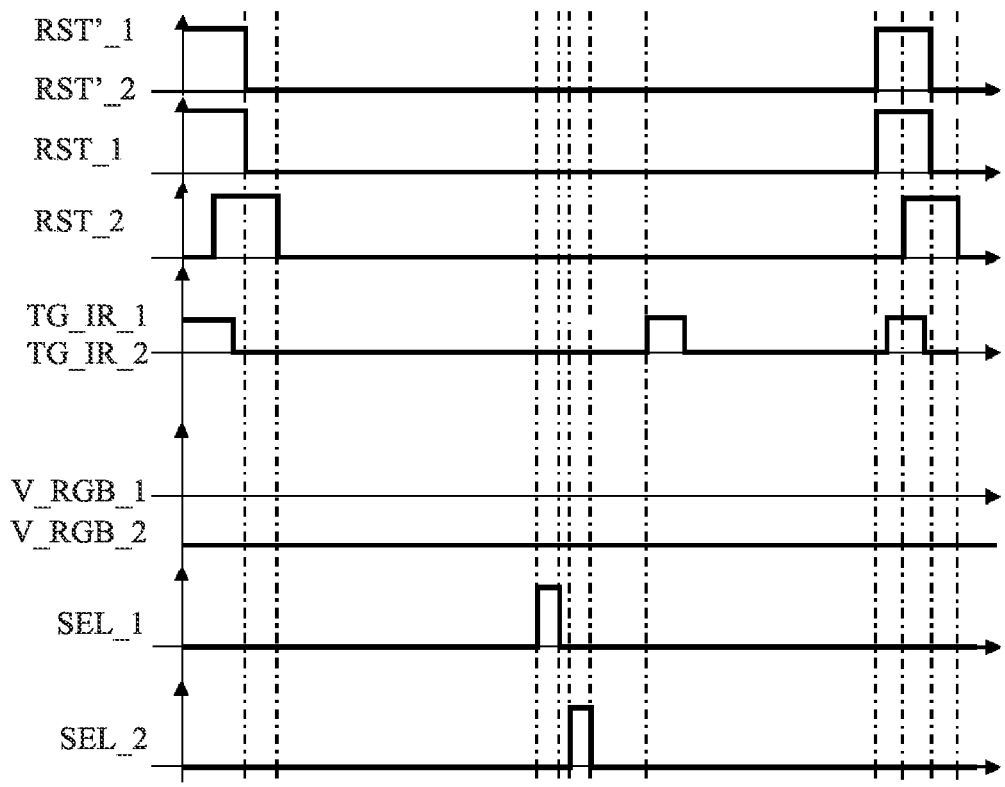
FIG. 13 is a timing diagram of signals of an embodiment of an operating method of the image sensor having the readout circuit of FIG. 9.

FIG. 13 is a timing diagram of signals RST'_1, RST'_2, RST_1, RST_2, SEL_1, SEL_2 and of potentials V_RGB_1 and V_RGB_2 during another embodiment of a method of operation of the image sensor 6-6 shown in FIG. 9, considering first and second successive pixel rows, the signals and potentials associated with the first row comprising suffix "_1" and the signals and potentials associated with the second row comprising suffix "_2".

As shown in FIG. 13, signals V_RGB_1 and V_RGB_2 are permanently maintained in the low state. The integration phases of the infrared photodiodes of the two rows controlled by signals TG_IR_1 and TG_IR_2 are carried out simultaneously while the integration phase of the color photodiode of the first row controlled by signals RST_1 and SEL_1 is shifted in time with respect to the integration phase of the color photodiode of the second row controlled by signals RST_2 and SEL_2. This enables to implement a global shutter type readout method for the infrared photodiodes and a rolling shutter type readout method for the color photodiodes during which the integration phases of the pixel rows are shifted in time with respect to one another.

Various embodiments and variants have been described. It will be understood by those skilled in the art that certain characteristic of these various alterations, modifications, and improvements, and other variations will occur to those skilled in the art. In particular, the readout circuits shown in FIGS. 5 to 8 may be implemented with any of the sub-pixel structures shown in FIGS. 2 and 3. Further, the timing diagrams previously described in relation with FIGS. 9 and 10 may further be implemented with the readout circuits shown in FIGS. 5 to 8. Finally, the practical implementation of the embodiments and variants described herein is within the capabilities of those skilled in the art based on the functional description provided hereinabove.

The invention claimed is:

1. A color and infrared image sensor comprising a silicon substrate, MOS transistors formed in the substrate and on the substrate, first photodiodes at least partly formed in the substrate, a photosensitive layer covering the substrate, and color filters, the photosensitive layer being interposed between the substrate and the color filters, the image sensor further comprising first and second electrodes on either side of the photosensitive layer and delimiting second photodiodes in the photosensitive layer, the first photodiodes being configured to absorb the electromagnetic waves of the visible spectrum and of a first portion of the infrared spectrum and the photosensitive layer being configured to absorb the electromagnetic waves of the visible spectrum and to give way to the electromagnetic waves of said first portion of the infrared spectrum, the image sensor comprising, for each pixel of the color image to be acquired, at least first, second, and third sub-pixels each comprising one of the second photodiodes, one of the first photodiodes, and one of the color filters, the color filters of the first, second, and third sub-pixels giving way to electromagnetic waves in different frequency ranges of the visible spectrum, the image sensor comprising, for each pixel of the color image to be acquired, at least one fourth sub-pixel comprising one of the second photodiodes and one of the color filters, the color filter of the fourth sub-pixel being configured to block the electromagnetic waves of the visible spectrum and to give way to electromagnetic waves in a third portion of the infrared spectrum between the visible spectrum and the first portion of the infrared spectrum, the photosensitive layer being configured to absorb electromagnetic waves in said third portion of the infrared spectrum.

2. The image sensor according to claim 1, further comprising an infrared filter, the color filters being interposed between the photosensitive layer and the infrared filter, the infrared filter being configured to give way to the electromagnetic waves of the visible spectrum, to give way to the electromagnetic waves of said first portion of the infrared spectrum, and to block the electromagnetic waves of at least a second portion of the infrared spectrum between the visible spectrum and the first portion of the infrared spectrum.

3. The image sensor according to claim 2, further comprising an array of lenses interposed between the photosensitive layer and the infrared filter.

4. The image sensor according to claim 1, wherein, for each pixel of the color image to be acquired, the second electrode is common to the first, second, and third sub-pixels.

5. The image sensor according to claim 1, further comprising, for each first, second, and third sub-pixels, a readout circuit coupled to the second photodiode and to the first photodiode.

6. The image sensor according to claim 5, wherein the readout circuit is configured to transfer first electric charges generated in the first photodiode to a first electrically-conductive track and configured to transfer second charges generated in the second photodiode to the first electrically-conductive track or a second electrically-conductive track.

7. The image sensor according to claim 6, wherein the first photodiodes are arranged in rows and in columns and wherein the readout circuits are configured to control the generation of the first charges during first time intervals simultaneous for all the first photodiodes of the image sensor.

8. The image sensor according to claim 6, wherein the second photodiodes are arranged in rows and in columns and wherein the readout circuits are configured to control the generation of the second charges during second time intervals simultaneous for all the second photodiodes of the image sensor or shifted in time from one row of second photodiodes to another.

9. The image sensor according to claim 6, wherein the readout circuits are configured to control a first integration phase for the first photodiodes having a first duration and to control a second integration phase for the second photodiodes having a second duration different from the first duration.

10. The image sensor according to claim 6, wherein each readout circuit comprises at least one first follower-assembled MOS transistor, the second photodiode having a first electrode directly coupled to the gate of the first MOS transistor and the second photodiode having a second electrode coupled to the gate of the first MOS transistor, or to the gate of a second follower-assembled MOS transistor, via a third MOS transistor.

11. The image sensor according to claim 1, wherein the photosensitive layer is made of organic materials and/or contains quantum dots.

* * * * *